US009753080B2

(12) United States Patent
Andle et al.

(10) Patent No.: US 9,753,080 B2
(45) Date of Patent: Sep. 5, 2017

(54) PARTIAL DISCHARGE DETECTION SYSTEM (71) Applicant: Rosemount Inc., Shakopee, MN (US)

(72) Inventors: Jeffrey Charles Andle, Tewksbury, MA (US); Thomas M. Cunneen, Beverly, MA (US); Maly Chap, Lowell, MA (US)

(73) Assignee: Rosemount Inc., Shakopee, MN (US)

( * ) Notice: Subject to any disclaimer, the term of this patent is extended or adjusted under 35 U.S.C. 154(b) by 0 days.

(21) Appl. No.: 14/961,321

(22) Filed: Dec. 7, 2015

(65) Prior Publication Data
US 2016/0161543 A1    Jun. 9, 2016

Related U.S. Application Data (60) Provisional application No. 62/089,360, filed on Dec. 9, 2014.

(51) Int. Cl.
*G01R 31/12* (2006.01)
*G01R 31/14* (2006.01)

(52) U.S. Cl.
CPC ..... *G01R 31/1272* (2013.01); *G01R 31/1218* (2013.01); *G01R 31/14* (2013.01)

(58) Field of Classification Search
CPC ...... G01R 31/02; G01R 31/021; G01R 31/12; G01R 31/1218; G01R 31/1272;
(Continued)

(56) References Cited

U.S. PATENT DOCUMENTS 5,063,931 A * 11/1991 Leavitt ............... A61B 8/06
600/453
5,612,930 A * 3/1997 Hazony ............... G01H 3/00
310/336
(Continued)

FOREIGN PATENT DOCUMENTS

CA    2 192 856    9/2000
CA    2 455 206    5/2012
(Continued)

OTHER PUBLICATIONS

"Advanced Measuring System for the Analysis of Dielectric Parameters including PD Events", by Lemke et al, Electrical Insulation Conference and Electrical Manufacturing & Coil Winding Conference, Oct. 1999.
(Continued)

*Primary Examiner* — Hoai-An D Nguyen
(74) *Attorney, Agent, or Firm* — Westman, Champlin & Koehler, P.A (57) ABSTRACT

A partial discharge detection system for detecting partial discharge events in an electrical component includes a transducer configured to receive a signal from the electrical component generated due to an occurrence of a partial discharge and responsively provide a transducer output. A signal processing chain includes a filter coupled to the transducer which filters the transducer output signal and responsively generating a filtered output. A digital signal processor performs a Discrete Fourier Transform (DFT) on the filtered output and generates coefficients which correspond to different modulation frequencies of the filtered, output. A controller identifies an occurrence of a partial discharge in the electrical component based upon the plurality of coefficients.

29 Claims, 5 Drawing Sheets (58) Field of Classification Search
CPC .... G01R 31/14; G01R 31/24; G01R 31/2635; G01R 31/44; G01N 27/20; G01N 27/205; H04B 3/46
USPC ....... 324/500, 512, 536, 537, 539, 541, 543, 324/544, 551, 557, 403, 409
See application file for complete search history.

(56) References Cited

U.S. PATENT DOCUMENTS

| | | | | |
|---|---|---|---|---|
| 5,933,012 | A | * | 8/1999 | Bengtsson ........... G01R 15/181 324/524 |
| 6,172,862 | B1 | * | 1/2001 | Jonnatti ............... H02H 1/0015 340/647 |
| 6,297,642 | B1 | | 10/2001 | Shibahara et al. |
| 6,424,162 | B1 | | 7/2002 | Rokunohe et al. |
| 6,483,316 | B2 | | 11/2002 | Kato et al. |
| 6,774,639 | B1 | * | 8/2004 | Unsworth ............. H01H 33/26 324/535 |
| 7,071,701 | B2 | | 7/2006 | Roman et al. |
| 7,577,535 | B2 | | 8/2009 | Anderson et al. |
| 7,676,333 | B2 | | 3/2010 | Younsi et al. |
| 7,912,660 | B2 | | 3/2011 | Anderson et al. |
| 8,271,213 | B2 | | 9/2012 | Xu et al. |
| 8,466,690 | B2 | | 6/2013 | Stewart et al. |
| 2005/0035768 | A1 | * | 2/2005 | Rabach ................ G01R 31/346 324/546 |
| 2005/0194979 | A1 | | 9/2005 | Roman et al. |
| 2008/0309351 | A1 | | 12/2008 | Stewart et al. |
| 2013/0234726 | A1 | | 9/2013 | Hobelsberger |

FOREIGN PATENT DOCUMENTS

| | | |
|---|---|---|
| CA | 2 821 795 | 7/2012 |
| EP | 0 061 254 | 10/1985 |
| EP | 1 222 472 | 8/2006 |
| EP | 2 063 276 | 5/2009 |
| EP | 2 324 364 | 5/2012 |
| JP | 2002-131366 | 5/2002 |
| JP | 2004-61358 | 2/2004 |
| KR | 10-1280763 | 6/2013 |
| KR | 10-1285146 | 7/2013 |
| KR | 10-2013-0060442 | 10/2013 |
| WO | WO 2007/070942 | 6/2007 |
| WO | WO 2013/038210 | 3/2013 |
| WO | WO 2013/124886 | 8/2013 |
| WO | WO 2013/131948 | 9/2013 |
| WO | WO 2013/136793 | 9/2013 |
| WO | WO 2013/139131 | 9/2013 |

OTHER PUBLICATIONS

"Ubiquitous UHF Monitoring System for Partial Discharge Detection and Trending", by Andle et al., IEEE., Nov. 2015.

Notification of Transmittal of the International Search Report and the Written Opinion of the International Searching Authority from PCT/US2015/064385, dated Mar. 30, 2016.

* cited by examiner

PARTIAL DISCHARGE DETECTION SYSTEM

CROSS-REFERENCE TO RELATED APPLICATION

The present application is based on and claims the benefit of U.S. provisional patent application Ser. No. 62/089,360, filed Dec. 9, 2014, the content of which is hereby incorporated by reference in its entirety.

BACKGROUND

The present invention relates to diagnostics of electrical components. More specifically, the present invention relates to a partial discharge detection system for detecting a partial discharge in such electrical components.

High voltage electrical components such as those used in power distribution and switching, use dielectric materials or other insulators to provide electrical insulation. In some instances, the insulator can completely fail leading to a discharge path through the electrical insulator. However, in other instances, a partial discharge or arc or flashover may occur through only a small portion of the insulator. Such an event does not typically immediately result in a complete failure of the electrical insulator but does lead to degradation of the component and may eventually lead to a complete failure.

Dielectrics (insulators) are specified to have a breakdown voltage well above the operational requirements to provide a margin of safety against localized defects and aging. Recently manufactured assets for medium and high voltage are typically tested for defects and weak spots at commissioning; however numerous aging assets have insulators of unknown quality. Furthermore, as insulators age, weak spots become weaker and defects evolve and expand. Under certain load conditions a dielectric breakdown will initiate across the defect, causing a partial arc between the conductors at different potentials and/or within cracks and voids within the dieletric.

As opposed to a complete flashover, the partial discharge does not provide a high current path between conductors. The localized fault is confined to the defect and the fault current is limited by the capacitive reactance of the remainder of the insulator thickness in series with the defect. Such defects can happen along the surface of an insulator (e.g. tracking faults) or internal to a solid insulator. A more common class of surface discharge occurs near a metal-air boundary at sharp edges. Electrons emitted from the sharp edge ionize the air, causing a corona discharge.

In any case, the breakdown of the defect causes a small, but sudden, rise in current ranging from a few milliamperes to a few Amperes lasting for about a nanosecond. The result is a sudden discharge ranging from a few picocoulombs to tens of nanocoulombs. A distressed insulator could have as few as a single defect to an arbitrarily large number of defects. Where multiple defects exist, they will typically occur at unique breakdown voltages, therefor being distributed over time or phase of the line voltage.

Since the discharge is limited in intensity and confined to a defect, it is not an immediate threat to the health of the asset. However, the collapse of an electric potential through a current spike represents a highly localized dissipation of electric power. While the electric potential that collapses is a fraction of the system working voltage, it ranges from several hundred to several thousand volts and represents an instantaneous power ranging from a few Watts to a few kilowatts.

While the energy losses are not an operational concern at such low levels and time durations, the results can be problematic. Even though the total energy losses are small because of the short duration; each discharge causes additional stress to the defect, which worsens over time.

Partial discharge can be recognized by any of a number of consequences and symptoms. The discharges cause voltage or current spikes that travel along the conductors until they are dissipated—either through conductive losses, reactive dispersion, or electromagnetic radiation of energy as ultra high frequency (UHF) and very high frequency (VHF) emissions. The ultimate fate of these pulses depends greatly on the nature of the defect location. Pulses are known to travel kilometers along shielded cable since the conductor losses are low and the shielding reduces electromagnetic radiation. The most significant influence of such propagation is that the cables are low loss transmission line filters and, with increasing distance, the detectable energy is concentrated at low frequencies. If the pulses are not completely radiated or dissipated, they eventually terminate to earth as transient earth voltage (TEV) faults.

In other assets the situation is different and radiative losses are more likely. The discharges therefore often cause electromagnetic emissions at the point of discharge that can interfere with radio communications nearby if the defect is in an outdoor asset. The interference with AM radios was one of the first symptoms used to detect and identify partial discharge. Energy is also dissipated as ultraviolet and acoustic emissions if the defects are sufficiently close to an air boundary.

In addition to the energy emissions (radio waves, ultrasound, and optical) that occur during a discharge, there are visual indications of past discharges including pitted damage to conductors, deformation and discoloration of insulators from the localized heating, and deposition of oxidized material as a fine white powder.

The use of AM radios to detect the interference is a classic technique; however early versions of this method were not quantitative nor were they able to verify that the source of interference was from partial discharge as opposed to corona or conducted interference from radio equipment being radiated from connected equipment.

One of the most reliable methods for detection and analysis of partial discharge is the direct observation of the current and voltage spikes. The sudden discharge is always associated with a localized change in current with an average impulse current equal to the discharge divided by the duration of the event. Since all electrical systems have finite transmission line impedance, the current spike has a corresponding voltage spike. Using a high voltage capacitive coupler to sample the voltage pulse or a high frequency current transformer to sample the current pulse gives a nearly direct picture of the discharge. There is still some variability in the detectable pulses at accessible locations in the asset depending on the location of the defect; however this variability is generally believed to be smaller than for other methods of detection and most analytical equipment uses this method. IEC60270 accounts for this uncertainty by referring to the calibrated scale as apparent charge. That is, it is the measured or "apparent" charge response that correlates to a reference charge injected to the equipment at a reference location. Real discharges occurring at locations other than the reference location might deviate from the reference value, and thus the apparent value, but are quantified by their apparent magnitude.

The measurement of apparent charge has several strengths, including an ability to analyze the pulse shape of each pulse and the ability to assemble a graph of the discharge events relative to the phase of the power line waveform, called phase-resolved partial discharge (PRPD).

Advanced methods add numerical analysis of the pulse shape of individual pulses to discern valid discharges from other sources of current and voltage spikes. Systems using multiple detectors can employ time of flight analysis to locate the defect.

The direct observation has significant drawbacks. The foremost is expense. While the cost of failures in the electric grid almost always outweighs the cost of prevention, analytical instruments are still too expensive to be deployed as ubiquitous, early warning systems.

Furthermore, while the detailed information is critical to determining the location and root cause of discharges, there is simply too much information for ubiquitous deployment and the SCADA (Supervisory Control and Data Acquisition) requirements would be overwhelming. Finally, the coupling detectors are contact methods of measurement. While they are designed for safe operation at the rated voltages, dust, humidity, and breakdown of the nearby insulators can impair their safety over time. As permanent, early warning systems these solutions have been historically limited to extremely high value generation and transmission assets with less widespread deployment down the distribution network, where they are typically deployed after a problem is suspected.

Indirect analytical instruments measure surface transients on grounding material (transient earth voltage, TEV), high frequency current transformer (HFCT) signals, or radiated energy detected to baseband to obtain a signature of the original pulses. While indirect methods inherently lose some of the analytical information on the pulse signature, the time of flight and phase-resolved timing of the direct methods are retained. So is the overwhelming burden of data.

The indirect analytical instruments eliminate the safety concern by offering noncontact operation and are also capable of temporary installation onto live systems. The systems can also be somewhat lower cost, although typically with reduced analytical capability. Their additional drawback is a loss of calibration. The transduction of a discharge to the indirect parameter (TEV, VHF, UHF, acoustic, and optical) is not able to be quantitatively predicted so the systems are calibrated to an external stimulus and relative measurements of partial discharge are made.

The direct and indirect methods above are all time domain analytical methods using broadband analysis of individual pulses.

Another class of detection uses narrowband (frequency domain) analysis based on power spectral density of the emitted energy. These methods can be used with direct or indirect coupling and are especially common in UHF analysis. There can be several problems in acquiring such a frequency spectrum because the source signal can be transient while common spectrum analyzers sweep a narrowband detector through a range of frequencies. Unless the discharge is present at that point of time in the sweep process, a discharge signal might be missed. Despite this, narrowband methods are believed to be a powerful method of scanning a site for sources of partial discharge and of characterizing such discharges.

These techniques sacrifice time/phase information in exchange for a somewhat simpler and safer measurement method. Even so, narrowband methods still suffer from an excess of data and difficulty of analysis by laypersons. There is an unmet need for an early warning monitor that is capable of distilling the complex data of either broadband or narrowband detection into concise, trendable data.

SUMMARY

A partial discharge detection system for detecting partial discharge events in an electrical component includes a transducer configured to receive a signal from the electrical component generated due to an occurrence of a partial discharge in the electrical component and responsively provide a transducer output signal to a signal processing chain A signal processing chain comprises one or more of the following. A filter coupled to the transducer filters the transducer output signal and responsively generating a filtered output. An amplifier coupled to the filter amplifies the filtered output and responsively provide an amplified output. A detector converts the amplified output to a detected baseband signal. A filter removes elements of the baseband signal that are not characteristic of partial discharge and outputs a filtered baseband output. A peak hold system matches the time scale of partial discharge events to the timescale of an analog to digital conversion process, resulting in a sampled, filtered, baseband signal. A digital signal processor performs a Discrete Fourier Transform (DFT) on the filtered baseband output and responsively generates a plurality of coefficients which correspond to a plurality of different modulation frequencies of the sampled, filtered, baseband signal. A controller identifies an occurrence of a partial discharge in the electrical component based upon the plurality of coefficients.

DETAILED DESCRIPTION OF ILLUSTRATIVE EMBODIMENTS

A partial discharge detection system is provided for detecting the occurrence of one or more partial discharges within an electrical component. The system operates using a signal received from the electrical component generated by a partial discharge. The signal may be an optical, ultrasonic or VHF/UHF signal. VHF/UHF signals may be directly capacitively coupled, indirectly inductively coupled (by HFCT), or remotely detected by antennas. The configuration provides a reliable low cost system for detecting partial discharges.

As discussed in the Background Section, partial discharges occur in electrical component such as high voltage switching equipment, and can lead to the ultimate failure of such equipment. A partial discharge emission occurs due to a localized dielectric breakdown of insulation. The emission may occur as a single or multiple rapid events with nanosecond duration, and microsecond to millisecond intervals each presenting as a discrete broadband event, causing a current spike between conductors. This causes impulses to travel as wavelets on conductors radiating UHF energy as they dissipate. The discharges may occur on a surface of a component, or may occur somewhere within the component.

Figure 1:
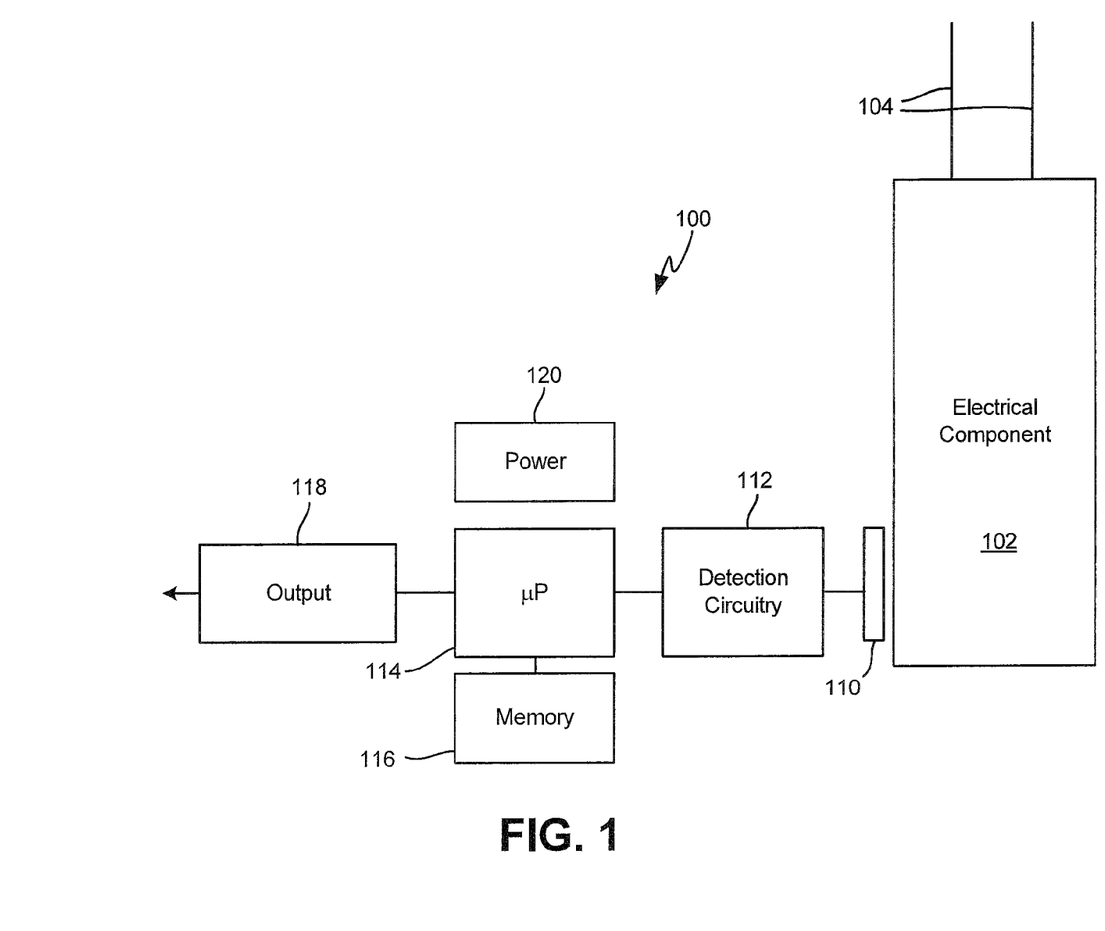
FIG. 1 is a simplified block diagram showing a partial discharge detection system arranged to detect partial discharge in an electrical component.

FIG. 1 is a simplified block diagram of partial discharge detection system 100 arranged to detect partial discharges from electrical component 102. The electrical component 102 may be any appropriate electrical component in which partial discharge events occur. The component 102 is illustrated as being connected to a power grid 104.

Partial discharge detection system 100 includes a transducer 110 arranged proximate the electrical component 102. The transducer 110 may be positioned within a housing of the component 102 or may be positioned, in some configurations, external to a housing of component 102. The transducer 110 may be in accordance with any appropriate technology including an antenna, capacitive contact, contact, or HFCT configured to receive radio frequency emissions, an acoustic or ultrasonic sensor, as well as an optical detector. Detection circuitry 112 is arranged to receive a signal from transducer 110 and provide a detected signal to a microprocessor 114. The detection circuitry 112 is configured to detect the signal from the transducer and may include an amplifier, filter or other components. Microprocessor 114 operates in accordance with instructions stored in a memory 116. Microprocessor 114 provides an output using output circuitry 118 when a partial discharge event is detected. A power supply 120 is illustrated and is used for powering circuitry of system 100. The power supply may be an internal power supply, for example, provided by a battery, or may be power received from an external source. Operation of the detection circuitry is described below in more detail.

As discussed above, partial discharge in insulators is one of the leading causes of asset failure for example, in medium voltage (MV) generation, transmission, and distribution assets. One estimate attributes nearly 46% of failures in MV electrical equipment to partial discharge (PD). Notably a significant number of these PD failures are ultimately humidity driven, and the next highest proportion of failures are thermal in nature. While generators and large power transformers are the bottlenecks of the power grid, the assets with the highest average downtime hours per year are distribution switchgear. Because of the quantity of switchgear in the distribution system and their downtime, they are ideal candidates for continuous asset monitoring.

When using radio frequency emissions to detect a partial discharge, one design constraint that might be chosen is to avoid frequencies below about 125 MHz. This is driven by two factors—avoidance of digital noise and conducted radio frequency interference up to 100 MHz along with the FM broadcast band. For antenna based systems this is further driven by the receiving antenna physical size relative to the space allowed in a compact medium voltage asset. Since small antennas are desired, electronics that analyse low frequencies will have poor signal to noise ratio below a cutoff frequency inversely proportional to size. Conversely HFCT are band limited and analysis of frequencies much beyond 300 MHz only adds noise. The design of the filters and signal chain are optimized to the preferred transducer using methods well known to those skilled in the art.

The use of in situ measurements inside metal enclosed or metal clad MV switchgear significantly reduces noise contributions from nearby broadcast systems and strongly attenuates the emissions from short range devices (SRD) installed within the neighboring switchgear. Conducted radio frequency interference from connected equipment may still exist and may still interfere. The use of a banded UHF PD detection system allows specific frequencies to be filtered to optimize detection methods and algorithms Using the techniques discussed herein, UHF PD monitoring has been successfully performed in 40 year old, outdoor, ANSI C37.20 switchgear, within 100 meters of a cellular base station and within multiple high voltage test labs on the latest, and most compact, switchgear designs. Nonetheless, the methods of signal processing and analysis are equally applicable to other transduction means and are still considered in the scope of the present invention.

The sensitivity of a radio receiver is described by the noise figure, which is a dB ratio of the input noise compared to the thermal noise. A fundamental design challenge is to provide sufficiently low noise figure in the measurement band while avoiding "jamming" by large signals outside the desired band. The losses should be minimized up to the first low noise amplifier (LNA), which ideally places filtering after the LNA. On the other hand, LNA's are not capable of passing small signals in the presence of a larger, saturating signal. Therefore, the band filters were placed ahead of the LNA in the example design. The relative location and selection of filters and LNA's is a matter of technical choice and is not critical to the practice of the present invention.

In one configuration, three filter bands (nominally 300 MHz, 600 MHz, and 1200 MHz) are used and were chosen to minimize interference from the most likely sources of UHF signals. Foremost is the interference from neighboring systems which may be employed to perform temperature measurements inside the same MV switchgear. For this reason the frequencies slightly below and above 433 MHz are intentionally rejected, as are GSM bands. Similarly, 868 MHz ISM devices in Europe, Asia, and Africa are anticipated, as are 902-928 MHz devices in the Americas. These can comprise high power transmitters in close proximity—for example 1 to 4 W radio frequency identification (RFID) transmitters might be placed within the switchgear. Also in this band are 850 MHz and 900 MHz global system for mobile (GSM) frequencies, and 40 W GSM transmitters could be only meters away.

Figure 2:
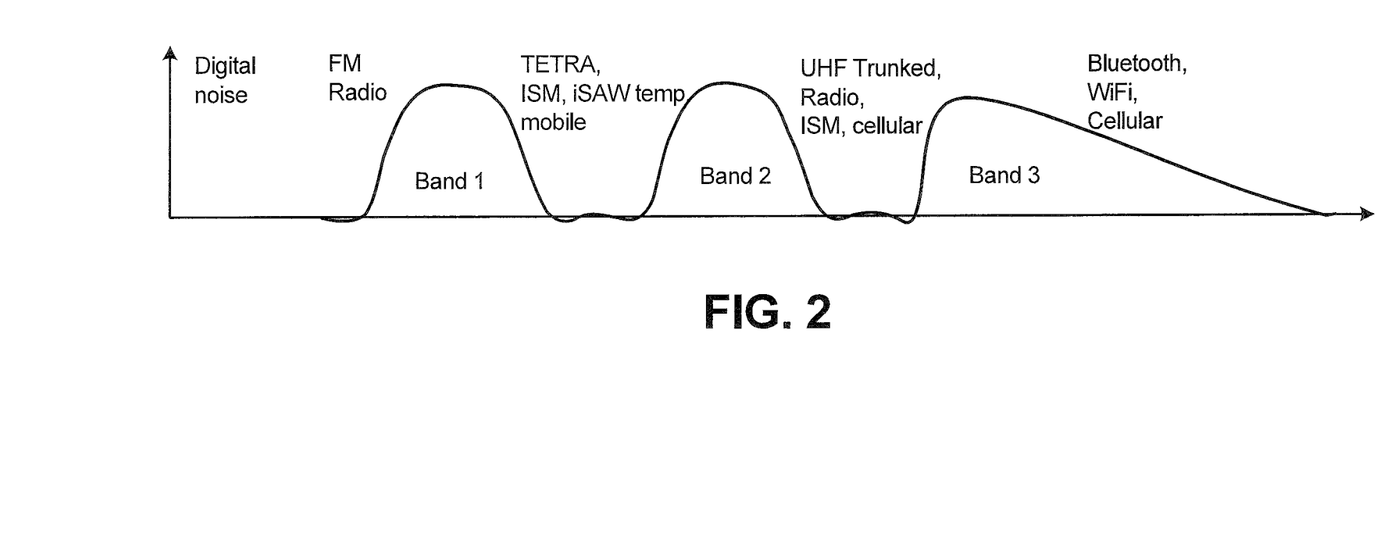
FIG. 2 is a graph showing noise level versus frequency for a number of noise sources along with three frequency bands for use in detecting partial discharge.

The lower limits are dictated by the need to reject up to 108 MHz FM broadcast and 100 MHz clock frequencies in the DSP. The upper limits are less clearly defined; however 1800 MHz and higher frequency cellular signals should also be avoided. In the example design, the losses of the electronics and antenna above 1500 MHz are relied on, as is the shielding of the switchgear. The requirements for rejection at 433 MHz and 860-900 MHz determines the crossover frequencies between the three bands. The resulting filter bands are illustrated in FIG. 2. Again, different circuit conditions and transducer selections would result in different technical choices regarding lower and upper frequencies of analysis. Gas insulated switchgear (GIS) tend to favor even high frequencies and tend to have excellent shielding, favoring smaller antennas and 1-5 GHz detection electronics.

Low cost, consumer grade inductors and capacitors can be used to implement the circuitry, resulting in total losses from the input to the LNA of as much as 6 dB. Higher performance components will lower losses and decrease noise. The LNA noise figure (NF) is 2 dB. The overall noise figure, NF, is 8 dB. The bandwidth, B, in the lower filter is approximately 175×10⁶ Hz. The equation for noise floor sensitivity, S, in the absence of an interfering signal is $$S=-174+NF+10 \log_{10}(B) \quad \text{Equation 1}$$

For the lower band the thermal noise floor is −83.6 dBm. A 6 dB improvement be obtained by placing the LNA immediately at the inputs; however antenna switching, function selection, and other required filtering for EMC introduce a significant portion of the losses. The incremental improvement achieved by swapping the LNA and band filters is achieved at the cost of a severe and debilitating saturation of the input LNA by strong out-of-band radio transmitters. Alternately, 10 dB of improvement may be obtained by reducing the bandwidth of each filter to 17.5 MHz. Similar noise floor results are obtained for "600 MHz" band 2 and "1200 MHz" band 3 as for "300 MHz" band 1.

A 17 cm monopole antenna typically has 3.2 dBi gain and 2 dB of internal losses in the mid UHF (433 MHz). Monopoles are commonly used in handheld surveying tools, given their efficiency; however only large generator circuit breakers are suitably dimensioned to incorporate such a large antenna while maintaining the basic insulation level (BIL) rating of the switchgear. The full height monopole has relatively wide bandwidth, but is still incapable of meeting the requirements of the frequency bands identified above.

A number of broadband antenna structures exist. One of the most promising is the Archimedes spiral. Initial measurements were made with a previously-designed Archimedes spiral that was intended to span at least 400-950 MHz for colocation of surface acoustic wave (SAW) measurements and RFID measurements. At 300×300×20 mm, the spiral antenna is suitably dimensioned to most switchgear; although a smaller antenna is ultimately desired. A more significant issue is the bidirectionality of the spiral and the negative reflection from the supporting ground plane. This results in poor antenna efficiency when mounted close to the metal walls of a switchgear. This was notably true at the temperature sensor frequencies around 433 MHz.

A thicker, cavity-backed spiral may be well suited for use as a transducer one approach is to further miniaturize the spiral antenna. While spiral antennas offer the most uniform properties over a wide range of operating frequencies, they are often too expensive for in situ applications.

Figure 3:
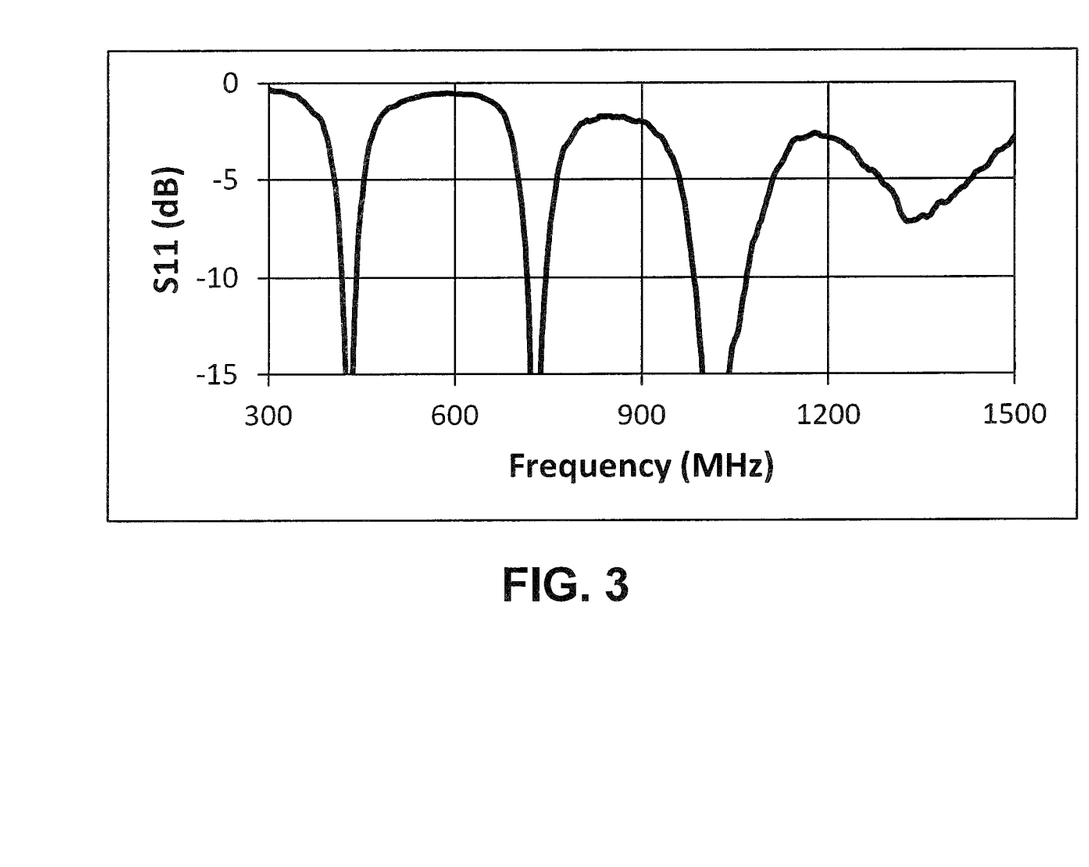
FIG. 3 is a graph of antenna sensitivity versus frequency of an antenna for use as a transducer and the partial discharge detection system of FIG. 1.

The patch inverted-F antenna (PIFA) is well suited for use as a UHF transducer. The antenna operates reasonably well over much of the selected UHF bands, as seen in FIG. 3. Whereas the spiral antenna is inherently broadband, the PIFA is multi-band with many broad resonances. At 200× 175×43 mm, the antenna is well suited to even the most compact switchgear designs. Ideally the antenna resonances would be aligned by design with the filter bands of the detection circuitry.

Figure 4:
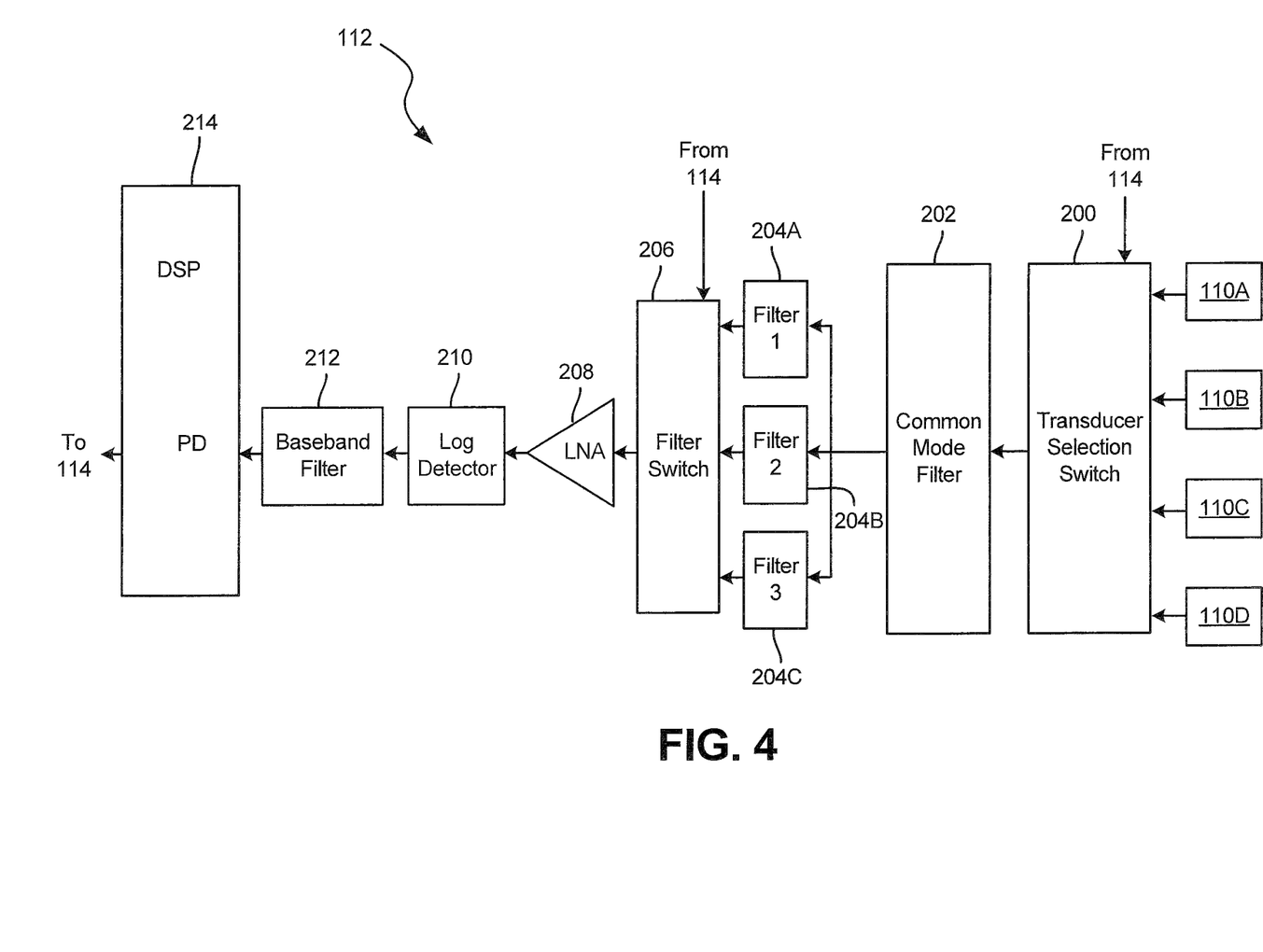
FIG. 4 is a simplified block diagram showing detection circuitry of FIG. 1 in more detail.

FIG. 4 is a simplified block diagram of detection circuitry 112. Detection circuitry 112 includes a transducer selection switch 200 coupled to a plurality of transducers 110A, 110B, 110C and 110D. An output from the transducer selection switch is provided to a common mode filter 202 which provides an output to a plurality of filters 204A, 204B and 204C. The common mode filter may optionally incorporate a filter feed selection switch. A filter switch 206 is switchable between outputs of the three different filters 204A-C and provides an output to a low noise amplifier (LNA) 208. The output from the low noise amplifier 208 is received by a log detector circuit 210 which provides a log detected baseband signal to a baseband filter 212. The output from the baseband filter 212 is provided to a digital signal processor (DSP) 214 which digitizes the output from the baseband filter 212 and is configured to perform computation on the digitized signal. As discussed below, such computation may include, for example, a discrete Fourier transform (DFT). The digital signal processor and analog to digital converter may be implemented in individual components, or may be embodied in an application specific integrated circuit (ASIC).

The detection circuitry of FIG. 4 is one of many architectures that can suitably transduce signals from partial discharge events to an ADC for analysis by a DSP. The given example and other examples known in the art are all suitable preprocessing circuits that may be used to obtain signals to be analyzed according to the present invention.

Because PD is a broadband phenomenon, the transducer interface and common mode filters should provide a good impedance match over a wide frequency range. The filters should reject switching transients from elsewhere and insertion losses should be minimized.

The sensitivity of the PD system 112 will determine the minimum detectable apparent charge. Sensitivity is limited by the insertion loss between the transducers 110 and the PD subsystem's LNA 208, and by the LNA's 208 noise figure, as well as by the ambient UHF noise level. The subsystems required for EMC/EMI compliance with safety and radio emissions (e.g. 4 KV impulse level electric fast transient) are not necessarily compatible with low noise figure over very wide bandwidths. The sensitivity required for reliable PD detection at picocoulomb (pC) levels of apparent charge depends on the transducer 110 and the equipment under test. It can be shown that LNA gain in excess of 20 dB is not beneficial in the example three-band system. The noise floor is seen to be on the order of −84 dBm while the log detector has a −65 dBm sensitivity.

If narrower bandwidth filters 204 are employed, e.g. with 17.5 dB bandwidth, then an LNA gain of 30 dB is needed to capitalize on the correspondingly lower noise floor. There are challenges in providing gain significantly higher than 40 dB in compact equipment without incurring internal oscillations.

Following the logarithmic detector 210, the baseband filter 212 rejects signals with modulation characteristics of other components such as a temperature sensor which may be implemented into close proximity for example, signals with baseband frequency content below 300 KHz. Filters 212 also rejects other low frequency modulation as well as signal content above the response frequency of the logarithmic detector of 6 MHz. Finally, filter 212 provides a peak detector with an RC time decay.

This peak detector is one difference between higher cost, analytical instruments and the present, ubiquitous, early warning detector. Analytical instruments performing phase resolved partial discharge (PRPD) require nanosecond-scale digitization of fast transients to count and quantify events associated with PD. They must then display large data sets that convey significant amounts of complex information. These analytical instruments often require a trained scientist to interpret the data set. In contrast, the present algorithm allows the use of low cost, microsecond-scale digitization with "on the fly" conversion to concise information. Although analytical detail is lost, the results are readily presented to the data processing tools, enabling system wide trending of developing asset failures using low-cost, autonomous instrumentation.

The DSP 214 is programmed to perform analog to digital (ADC) conversions with a sampling time just slightly longer than the computation time required to progress the digital filters. A typical sampling time for a 100 MHz DSP might be 3-4 μs. For each sample, nine discrete Fourier transform (DFT) calculations are updated in one implementation of the algorithm, while fewer or more might be suitable. The process is iterated over an even number of power frequency wave periods, providing Fourier components at multiples of half the line power frequency.

Figure 5:
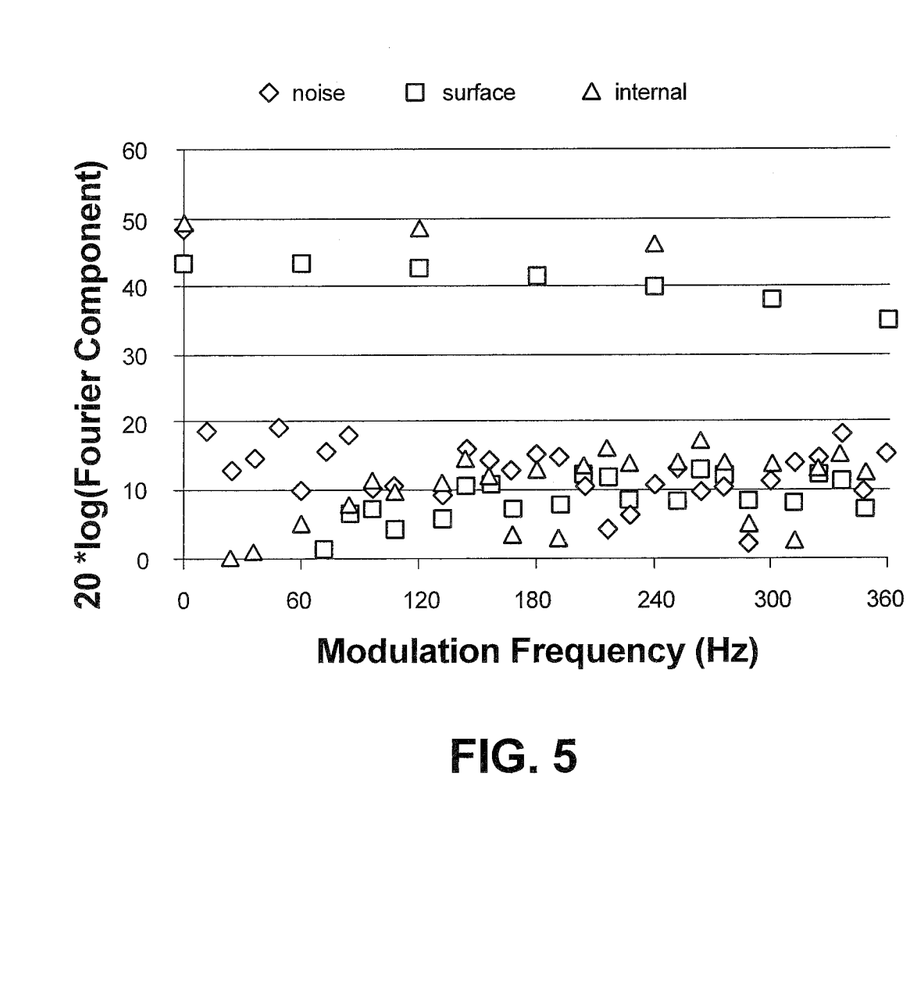
FIG. 5 is a graph of Fourier components versus frequency showing detected noise, surface discharge (corona) as well as internal partial discharge detected by the partial discharge detection system of FIG. 1.

FIG. 5 is a graph showing Fourier component at various frequencies in the transducer signal. Noise is always present—either at constant amplitude or with modulation uncorrelated to the line frequency. Absent any significant external, modulated source, noise will manifest itself as a constant term (zero frequency modulation of the logarithm of the UHF received power) plus low levels of modulation signal in all of the DFT terms at nonzero frequency. This is shown as diamonds in FIG. 5.

Corona discharge (also called surface discharge) occurs primarily on the negative half cycle of the power waveform, where electrons emitted from the metal ionize the air. Because events occur once per cycle, there are significant DFT results at both odd and even harmonics of the power line frequency, shown as squares in FIG. 5. Discharges between a point conductor and a plate through solid insulation may also show similar harmonic content. Corona discharges have been observed in 13.8 kV switchgear at relatively small overvoltage levels. Corona discharges are relevant in that they indicate poor encapsulation of bus bars and other ionizing defects. When corona forms, it reduces the effective clearance distances and increases the risk of flashover, for example during a lightning transient. While corona discharges in lower voltage systems may not cause a rapid, progressive damage, they do increase the risk of other failures.

Discharge within the bulk of materials between more or less symmetric conductors occur approximately equally for positive and negative polarity portions of the power cycle. Because of this, internal or symmetric partial discharge presents as even harmonics, shown as triangles in FIG. 5. Discharges along the surface of insulating spacers are also typically symmetric.

Partial discharge within the insulators can cause progressive damage to the insulation and is a much more serious problem in lower voltage (e.g. 4 kV-24 kV) systems than is corona. Many UHF survey tools cannot differentiate corona from PD. With the present invention, a user can discriminate and to act on the two classes of defect in different ways. Regardless of whether corona is deemed a problem in a given system or not, differentiating between corona and PD is almost always desirable.

At the onset of PD, where discharges occur in a narrow time window near the peak voltage, the DFT responses, and therefore the instrument response, are linear in the number of events. The system measures a cumulative PD activity per power cycle. On the other hand, the DFT terms are logarithmic in the magnitude of individual PD events. By counting the number of events, it is possible to estimate the geometric mean of the PD activity as:

$$\log(\overline{\rho}) \approx \frac{\sum_{i=1}^{N} \log(\rho_i)}{N}, \qquad \text{Equation 2}$$

where $\overline{\rho}$ is the mean symmetric discharge event magnitude, N is the number of discharge events per measurement period, and the sum of $\rho_i$ is estimated from the DFT terms as:

$$\sum_{i=1}^{N} \log(\rho i) = A \begin{pmatrix} \sqrt{x^2 + y^2 + z^2} \\ -B\sqrt{u^2 + v^2 + w^2} \\ -C\sqrt{r^2 + s^2 + t^2} \\ -D \end{pmatrix} \qquad \text{Equation 3}$$

A, B, C, and D are calibration coefficients where B and C are typically 1 and D is typically 0. The terms r, s, and t are DFT results at frequencies selected to indicate noise level, u, v, and w are selected to represent corona, and x, y, and z are selected to represent symmetric discharge processes. Noise level is obtained by selecting r, s, and t to be non-harmonics of the line power frequency. Corona is represented by selecting u, v, and w to be odd harmonics of the line power frequency and symmetric partial discharge is related to x, y, and z when they are from even harmonics.

It is possible to estimate the geometric mean of the Corona and asymmetric discharge activity as:

$$\log(\overline{\sigma}) \approx \frac{\sum_{i=1}^{N} \log(\sigma_i)}{N}, \qquad \text{Equation 4}$$

where $\overline{\sigma}$ is the mean asymmetric discharge event magnitude, N is the number of discharge events per measurement period, and the sum of $\sigma_i$ is estimated from the DFT terms as:

$$\sum_{i=1}^{N} \log(\sigma_i) \approx A \begin{pmatrix} \sqrt{u^2 + v^2 + w^2} \\ -C\sqrt{r^2 + s^2 + t^2} \\ -D \end{pmatrix}, \qquad \text{Equation 5}$$

As the PD activity fills an increasing large portion of the power waveform (high duty cycle), the coefficient of the DFT is no longer the linear summation of Equation (2). Instead the coefficient is decreased by a trigonometric factor. This quantitative desensitization at increasing PD activity levels represents a saturation effect and has no impact on early warning.

The specific selection of harmonics is a matter of technical choice and more or fewer harmonics may also be selected. Three harmonics are selected in the example embodiment because three phase power may have discharges on more than one phase, causing energy in more than one harmonic. Lower harmonics offer the advantage of reduced sensitivity to duty cycle and saturation of the harmonics with increasingly large numbers of defects at differing times. On the other hand, higher harmonics offer the advantage of avoiding directly coupled noise from the line power frequency. The method of the present invention may be practiced with one harmonic per group (e.g. r, u, and x), or with more than three harmonics per group using expansions of the sample math set forth herein. Other combinations of the DFT terms could equally well be used including nonlinear combinations. These should be considered to be extensions of the algorithm, which relies primarily on the use of differences between collections of DFT components to determine corona and PD relative to noise.

A PD detection system using band-pass filtered UHF detection is provided which is capable of avoiding strong interfering signals at close proximity. The same method is applicable to the signal from a photodetector, microphone, HFCT, or direct capacitive probe. Analysis methods that employ no, discrete Fourier transform methods can provide a clear and concise reporting of PD events needed for long-term trending. The system differentiates noise, corona, and PD. The system combines passive, non-contact sensing of temperature and partial discharge with humidity and ambient sensing to make available a comprehensive solution for real-time continuous critical asset monitoring. The combined system addresses most of the electrical failure mechanisms of switchgear and other critical power assets.

Microprocessor 114 monitors the output from the DSP 214. Based upon the output from the DSP 114, the microprocessor can provide an output, for example locally to an operator using a annunciation technique such as an audible or visual output, or the information may be transmitted to a remote location such as a control room. In another example, the output 118 is used to shut down the electrical component 102 to prevent further damage. The output can also provide an indication of a corona discharge or the amount of noise present. The output can be based upon a number of events which are detected over a period of time, a frequency at which a number of events are detected, an amplitude or strength of one or more events, or some combination thereof. The evaluation is performed simply by observing the coefficients of the discrete Fourier transform provided by the DSP 214.

Although the present invention has been described with reference to preferred embodiments, workers skilled in the art will recognize that changes may be made in form and detail without departing from the spirit and scope of the invention. Although the above discussion has been focused on UHF frequencies and transducers 110 comprising antennas, the transducers 110 may be in accordance with any technology including other radio frequencies, optical sensors, sonic and ultrasonic sensors, or other types. Any number of transducers may be employed and positioned internally and/or externally to cabinetry of the component being monitored. The transducers may be monitored continuously, or may be pulled, for example using the transducer selection switch 200 illustrated in FIG. 4 under the control of microprocessor 114. Although individual filters 204 are shown and a filter switch 206 is illustrated as being used to switch between the various filters 204, the outputs from the filters 204 may also be processed in parallel with multiple detection channels and ADC channels. Although the switching filter switch 206 and the transducer selection switch 200 are illustrated as being controlled by microprocessor 114, the switching may occur through any technique including a periodic switching, or switching under the control of some other device. Any number of filters 204 may be employed as desired. In another configuration, the characteristics of the filters 204 may be adjusted, either manually or under the control of a component within the system such as microprocessor 114. Although illustrated in the Figures as individual components, the digital signal processor and microprocessor may be implemented in a single microprocessor as separate cores in a field programmable gate array, etc. The microprocessor 114 is one example of a controller. Additional sensors such as temperature sensors may be employed and used to further refine the partial discharge detection system. The detection can be based upon an amplitude of the coefficients, a comparison to a threshold, a comparison between two or more coefficients, or other factors. As used herein, the term "signal processing chain" refers to any combination of filters, amplifiers, detectors or variations thereof. In the specific example set forth herein, the signal processing chain includes filter 202 and/or 204, amplifier 208, log detector 210 and baseband filter 212, either alone or in any combination. Further, other signal processing elements may be used to implement the signal processing chain. An antenna is one example of a radio frequency coupling structure. Other examples include a capacitor and/or an inductor/transformer coil. A peak detector can be implemented in the signal processing chain to hold nanoscale events for a sufficiently long time period to be detected by an A/D converter operating on a microsecond scale.

What is claimed is:

1. A partial discharge detection system for detecting a partial discharge in an electrical component, comprising:
a transducer configured to receive a signal from the electrical component generated due to an occurrence of a partial discharge in the electrical component and responsively provide a transducer output signal;
a signal processing chain including a detector which detects a baseband signal in the transducer output providing a filtered baseband output representative of the transducer output signal;
a digital signal processor configured to perform a Discrete Fourier Transform (DFT) on the filtered baseband output and responsively generate a plurality of DFT coefficients which correspond to a plurality of different frequencies; and
a controller configured to identify an occurrence of a partial discharge in the electrical component based upon the plurality of DFT coefficients.

2. The partial discharge detection system of claim 1, wherein the signal processing chain comprises:
a filter coupled to the transducer which filters the transducer output signal and responsively generates a filtered output;
an amplifier coupled to the filter which amplifies the filtered output and responsively provides an amplified output;
the detector which converts the amplified output to a detected baseband signal; and
a filter which removes elements of the baseband signal that are not characteristic of partial discharge and outputs a filtered baseband output.

3. The partial discharge detection system of claim 1 wherein the transducer comprises a radio frequency coupling structure.

4. The partial discharge detection system of claim 1 wherein the transducer comprises an optical detector.

5. The partial discharge detection system of claim 1 wherein the transducer comprises a microphone.

6. The partial discharge detection system of claim 3 wherein the radio frequency coupling structure comprises a UHF antenna.

7. The partial discharge detection system of claim 3 wherein the radio frequency coupling structure comprises a capacitor.

8. The partial discharge detection system of claim 3 wherein the radio frequency coupling structure comprises an induction coil.

9. The partial discharge detection system of claim 1 including a plurality of transducers.

10. The partial discharge detection system of claim 1 wherein the transducer is located within a housing of the electrical component.

11. The partial discharge detection system of claim 1 wherein the transducer is located external to a housing of the electrical component.

12. The partial discharge detection system of claim 9 including a transducer selection switch to switch between the plurality of transducers.

13. The partial discharge detection system of claim 1 wherein the signal processing chain includes a common mode filter configured to filter common mode signals from the transducer output signal.

14. The partial discharge detection system of claim 1 wherein the signal processing chain includes a band pass filter.

15. The partial discharge detection system of claim 1 wherein the signal processing chain includes a plurality of band pass filters configured to filter the transducer output signal.

16. The partial discharge detection system of claim 15 including a filter selection switch configured to switch between outputs of the plurality of the band pass filters.

17. The partial discharge detection system of claim 1 wherein the signal processing chain includes a log detector which provides a logrithmic output related to the amplified output.

18. The partial discharge detection system of claim 17 wherein the signal processing chain includes a baseband filter which filters a baseband signal by removing unwanted noise from the logrithmic output.

19. The partial discharge detection system of claim 1 wherein the signal processing chain includes a peak detector to hold nanosecond scale events sufficiently long to be detected by microsecond scale A/D converters.

20. The partial discharge detection system of claim 1 wherein the digital signal processor and controller are implemented in one or more microprocessors.

21. The partial discharge detection system of claim 1 wherein the digital signal processor and controller are implemented in a field programmable gate array.

22. The partial discharge detection system of claim 16 wherein the filter selection switch is controlled by the controller.

23. The partial discharge detection system of claim 12 wherein the transducer selection switch is controlled by the controller.

24. The partial discharge detection system of claim 1 wherein the controller identifies an occurrence of a partial discharge based upon a detection of even harmonics of a line power frequency in the plurality of DFT coefficients relative to other harmonics in a second plurality of DFT coefficients.

25. The partial discharge detection system of claim 1 wherein the controller is further configured to identify a corona discharge.

26. The partial discharge detection system of claim 24 wherein a corona discharge is identified based upon odd harmonics in the plurality of DFT coefficients relative to other harmonics in a second plurality of DFT coefficients.

27. The partial discharge detection system of claim 1 wherein an occurrence of a partial discharge is identified based upon a magnitude of a calculation in the plurality of DFT coefficients.

28. The partial discharge detection system of claim 1 wherein a partial discharge is identified based upon counting a number of events detected while calculating the plurality of DFT coefficients.

29. The partial discharge detection system of claim 1 wherein the controller identifies an occurrence of a partial discharge based upon a comparison to a threshold.

* * * * *